(12) United States Patent
Kajiyama et al.

(10) Patent No.: US 7,564,109 B2
(45) Date of Patent: Jul. 21, 2009

(54) MRAM AND METHOD OF MANUFACTURING THE SAME

(75) Inventors: Takeshi Kajiyama, Yokohama (JP);
Hisanori Aikawa, Yokohama (JP);
Tomomasa Ueda, Yokohama (JP);
Tatsuya Kishi, Yokohama (JP);
Masatoshi Yoshikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 10/917,300

(22) Filed: Aug. 13, 2004

(65) Prior Publication Data
US 2005/0275000 A1    Dec. 15, 2005

(30) Foreign Application Priority Data
May 25, 2004    (JP)    ............... 2004-154885

(51) Int. Cl.
*G11C 11/00*    (2006.01)
*G11C 11/14*    (2006.01)
*H01L 21/8246*    (2006.01)

(52) U.S. Cl. .................. 257/421; 257/E21.665; 438/3; 365/158; 365/171

(58) Field of Classification Search .............. None
See application file for complete search history.

(56) References Cited

U.S. PATENT DOCUMENTS

| 5,640,343 | A | * | 6/1997 | Gallagher et al. | 365/171 |
| 6,261,953 | B1 | | 7/2001 | Uozumi | 438/687 |
| 6,417,561 | B1 | * | 7/2002 | Tuttle | 257/659 |
| 6,555,858 | B1 | * | 4/2003 | Jones et al. | 257/295 |
| 2003/0001271 | A1 | * | 1/2003 | Uozumi | 257/758 |
| 2003/0090933 | A1 | * | 5/2003 | Hidaka | 365/158 |
| 2004/0075125 | A1 | * | 4/2004 | Asao | 257/295 |

FOREIGN PATENT DOCUMENTS

| JP | 2002-26018 | 1/2002 |
| JP | 2003-86774 | 3/2003 |
| JP | 2003-318366 | 11/2003 |

* cited by examiner

*Primary Examiner*—Andy Huynh
*Assistant Examiner*—Hoang-Quan T Ho
(74) *Attorney, Agent, or Firm*—Oblon, Spivak, McClelland, Maier & Neustadt, P.C.

(57) ABSTRACT

A magnetic memory device includes a first write wiring line including a wiring layer formed in a trench in an insulation layer, a barrier metal layer buried in the trench over the wiring layer. And the device includes a magneto-resistance effect element provided on the first write wiring line.

17 Claims, 9 Drawing Sheets

MRAM AND METHOD OF MANUFACTURING THE SAME

CROSS-REFERENCE TO RELATED APPLICATIONS

This application is based upon and claims the benefit of priority from prior Japanese Patent Application No. 2004-154885, filed May 25, 2004, the entire contents of which are incorporated herein by reference.

BACKGROUND OF THE INVENTION

1. Field of the Invention

The present invention relates generally to a magnetic memory device and a method of manufacturing the same, and more particularly to a magnetic random access memory (MRAM) and a method of manufacturing the same.

2. Description of the Related Art In a conventional cross-point type MRAM, for example, an MTJ (Magnetic Tunnel Junction) element is, in many cases, provided at a cross point between a bit line and a word line, and the word line is formed such that a metal such as Cu (copper) is buried in a trench in an insulation layer.

After a wiring layer such as a word line is formed in the trench by means of a damascene method, however, it is necessary to subject the metal to a wet etching process or heating treatment, thereby to enhance insulation properties (see, e.g. U.S. Pat. No. 6,261,953). In the step of wet etching, surface roughness occurs on the metal. In the heating treatment, too, surface roughness occurs on the metal since grain boundaries grow in the metal. If such surface roughness occurs on the metal and the surface of the word line becomes uneven, the cross-sectional shape of the MTJ element that is provided on the word line (WL) tends to be distorted in accordance with the uneven surface of the word line.

BRIEF SUMMARY OF THE INVENTION

According to an aspect of the present invention, there is provided a first write wiring line including a wiring layer formed in a trench in an insulation layer, a barrier metal layer buried in the trench over the wiring layer, a surface of the barrier metal layer being flatter than a surface of the wiring layer, and a magneto-resistance effect element provided on the surface of the barrier metal layer.

According to another aspect of the present invention, there is provided a method of manufacturing a magnetic memory device, the method comprising forming a trench in an insulation layer, the trench extending in one direction, forming a first magnetic layer along an inner wall of the trench, forming a metal layer on the first magnetic layer, flattening the magnetic layer and the metal layer and burying the magnetic layer and the metal layer in the trench, thereby forming a first yoke layer and a wiring layer, subjecting a surface of the first yoke layer and a surface of the wiring layer to wet etching, forming a barrier metal layer on the wiring layer that is recessed by the wet etching, flattening the barrier metal layer at a level of the surface of the first yoke layer and burying the barrier metal layer in the trench such that a surface of the barrier metal layer is continuous with the surface of the first yoke layer, and subjecting the wiring layer to heat treatment.

DETAILED DESCRIPTION OF THE INVENTION

Embodiments of the present invention will now be described with reference to the accompanying drawings. In the descriptions below, common parts are denoted by like reference numerals throughout the drawings.

FIRST EMBODIMENT (1T1MTJ TYPE)

Figure 1:
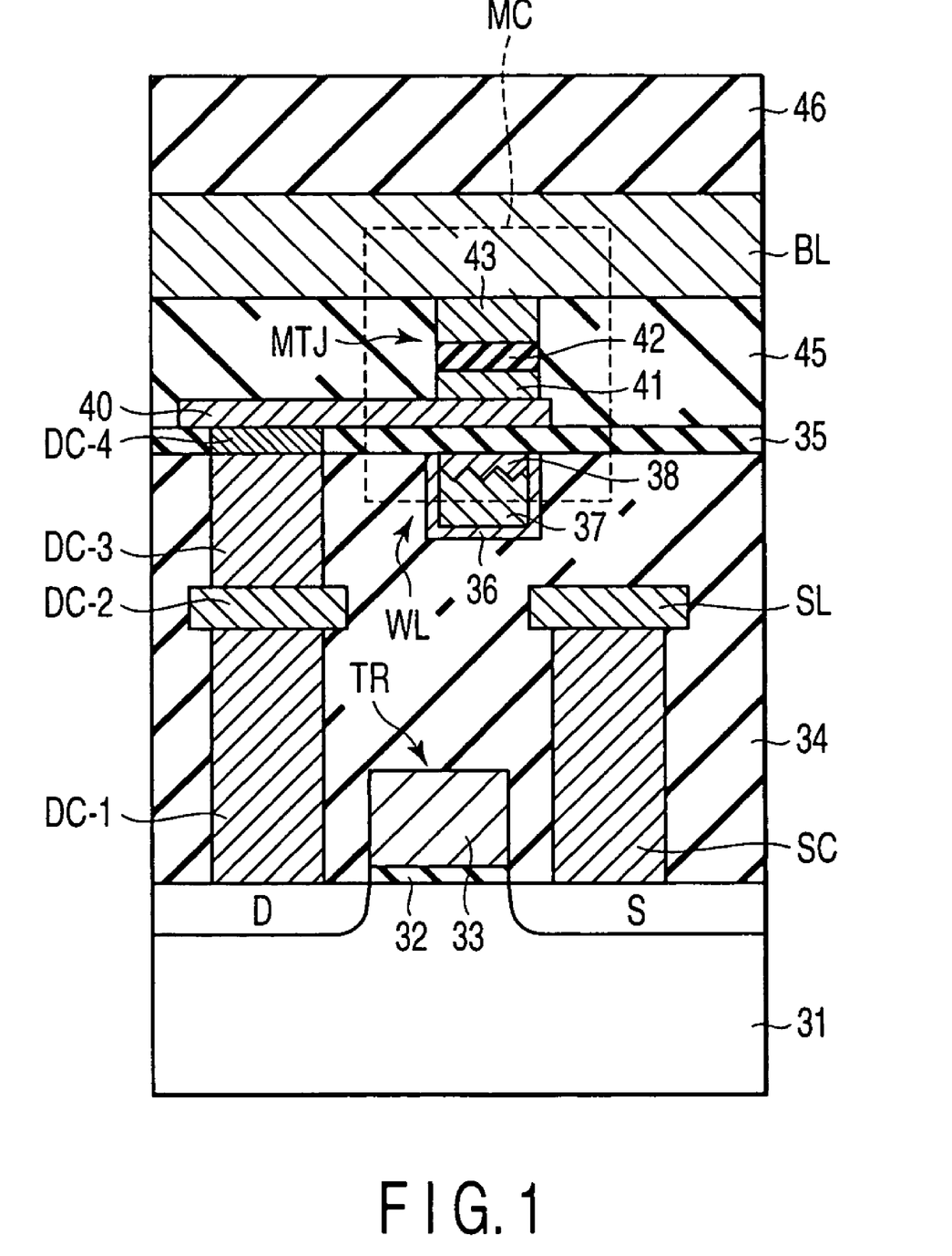
FIG. 1 is a cross-sectional view that schematically shows the structure of a magnetic memory device (1T1MTJ type) according to a first embodiment of the present invention.
Figure 2:
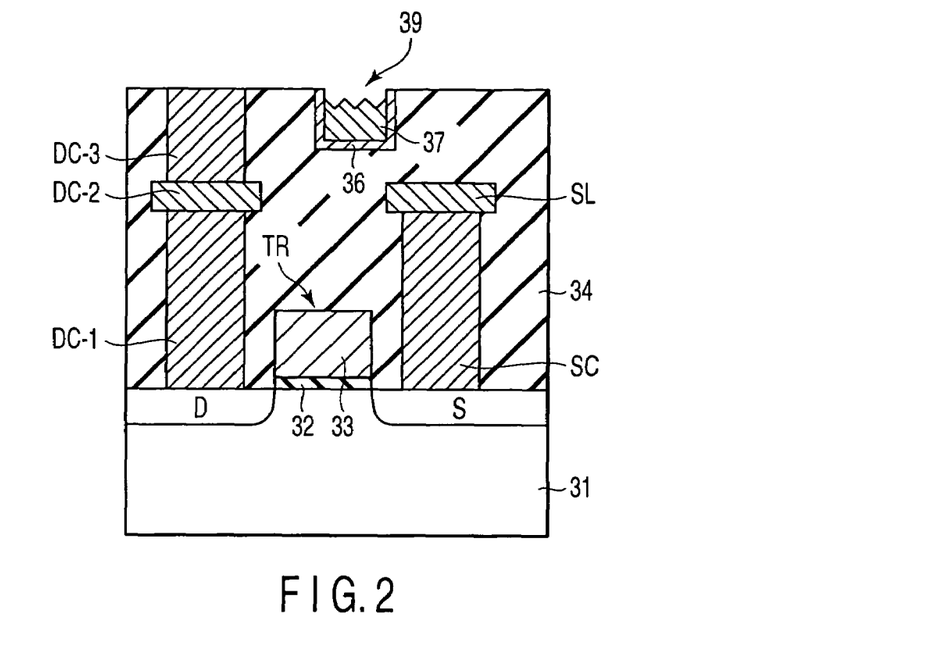
FIG. 2 is a cross-sectional structural view that schematically illustrates a fabrication step in a method of manufacturing the magnetic memory device according to the first embodiment of the present invention.
Figure 3:
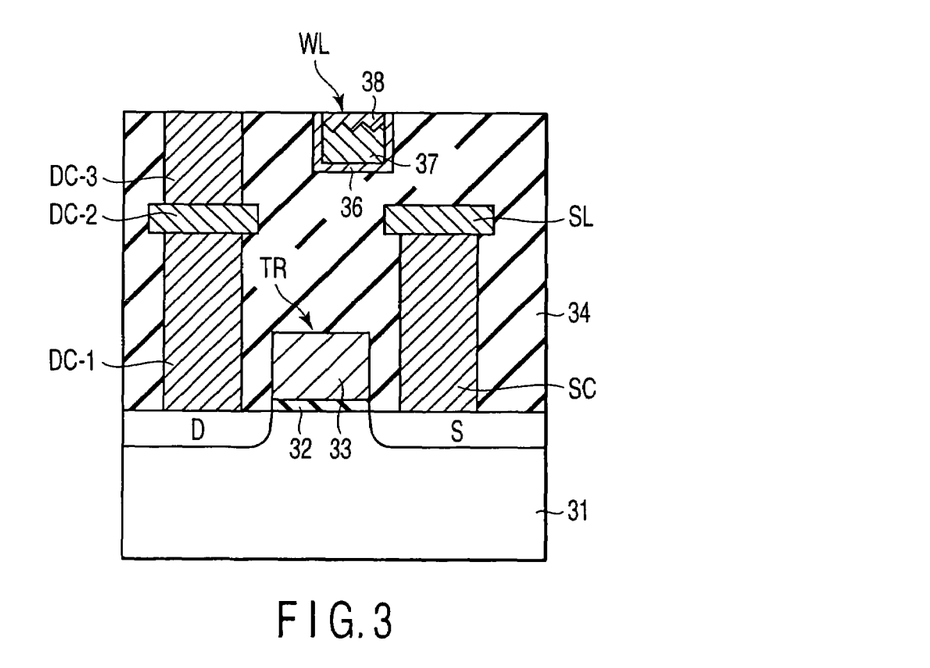
FIG. 3 is a cross-sectional structural view that schematically illustrates a fabrication step in the method of manufacturing the magnetic memory device according to the first embodiment of the present invention.

A magnetic memory device according to a first embodiment of the present invention and a method of manufacturing the same are described referring to FIG. 1 to FIG. 3. FIG. 1 is a cross-sectional view that schematically shows the structure of the magnetic memory device according to the first embodiment of the present invention. The magnetic memory device according to this embodiment is described by taking, as an example, a so-called 1T1MTJ (1 Transistor-1 Magnetic Tunnel Junction) type MRAM wherein an MTJ (Magnetic Tunnel Junction) element (magneto-resistance effect element) is electrically connected to one end of the current path of a transistor.

A transistor (select transistor) TR for selecting an MTJ element is provided on a major surface of the semiconductor substrate (Si substrate) 31. The MTJ (Magnetic Tunnel Junction) element (magneto-resistance effect element) is provided in an insulation layer 45 at an intersection between a bit line BL (write line) and a word line WL (write line). An insulation layer 46 is provided on the bit line BL. A region indicated by a broken line in FIG. 1 designates a 1-bit memory cell MC.

The transistor TR comprises a gate electrode 33, which is provided on the major surface of the substrate 31 with a gate insulation film 32 interposed, and a source S and a drain D, which are provided in the substrate 31 so as to sandwich the gate electrode 33. A source line contact SC is provided on the source S. A source line SL, which applies a common potential to sources S of a plurality of memory cells MC (not shown) that are provided along the word line WL, is provided on the source line contact SC. Drain contacts DC-1 to DC-4 are provided on the drain D. The drain contacts DC-1 to DC4 electrically connect the MTJ element and the drain D via an underlying conductive layer 40.

The MTJ element is configured, for example, such that a tunneling barrier layer (insulation layer) 42 is sandwiched between a free layer (ferromagnetic layer) 41 and a pinned layer (ferromagnetic layer) 43. The MTJ element stores "1" data or "0" data in a nonvolatile state, depending on whether the directions of magnetization of the free layer 41 and pinned layer 43 are parallel or antiparallel. The stored "1" data or "0" data is read out by making use of a so-called TMR (Tunneling Magneto-Resistance) effect of the magnetic tunnel junction (MTJ). The magnetization direction of the pinned layer 43 is fixed. The magnetization direction of the free layer 41 alone is switched between "parallel" and "antiparallel" by a composite field that is produced from the bit line BL and word line WL.

The word line WL comprises a Cu wiring layer (wiring layer) 37 that is buried in a trench formed in the insulation layer 34; a yoke layer 36 that is provided at an interface between the Cu wiring layer 37 and the trench; and a barrier metal layer 38 that is buried in the trench over the Cu wiring layer 37. The barrier metal layer 38 is formed of, e.g. Ta, Ti, TiN, or TaN. The yoke layer 36 is formed of a ferromagnetic material including a high-permeability magnetic material such as NiFe.

Information in the MTJ element is read out by detecting the resistance value of the MTJ element. When the magnetization direction of the free layer 41 is parallel to the magnetization direction of the pinned layer 43, the resistance value of the MTJ element is minimum, and the MTJ element is set, for example, in a "1" state. On the other hand, when the magnetization direction of the free layer 41 is antiparallel (i.e. opposite in the direction of the bit line BL) to the magnetization direction of the pinned layer 43, the resistance value of the MTJ element is maximum, and the MTJ element is set, for example, in a "0" state. The parallel and antiparallel states, which correspond to the "1" state and "0" state, can be switched by executing a write operation and reversing the magnetization direction of the free layer 41.

Specifically, the read operation is executed by causing an electric current to successively flow through the underlying conductive layer 40, free layer 41, tunneling barrier layer 42, pinned layer 43 and bit line BL. Further, the current is amplified and detected by, e.g. a sense amplifier (not shown) that is connected to the bit line BL. The resistance value is thus detected to complete the read operation.

On the other hand, information is written in the MTJ element by reversing the magnetization direction of the free layer 41 by application of a composite magnetic field that is generated by the word line WL and bit line BL. To start with, a current is let to flow in the word line WL. As a result, a magnetic field is generated around the word line WL according to so-called Ampere's rule. Similarly, a current is let to flow in the bit line BL, thereby generating a magnetic field around the bit line BL. The composite magnetic field that is generated by the word line WL and bit line BL reverses only the magnetization direction of the free layer 41 of the MTJ element. Thus, data can be written only in an MTJ element of a plurality of arrayed MTJ elements, which is provided at an intersection between a selected word line WL and a selected bit line BL.

The word line WL includes the yoke layer 36 that contains a high-permeability magnetic material and is formed at the interface between the Cu wiring layer and the inside of the trench. Thus, in the write operation, of the magnetic fluxes generated from the word line WL, most of magnetic fluxes that come from the bottom and side surfaces of the word line WL are led to the yoke layer 36.

As has been described above, in the magnetic memory device according to this embodiment, the Cu wiring layer (wiring layer) 37 is buried in the trench that is formed in the insulation layer 34, and the barrier metal layer 38 is buried in the trench over the Cu wiring layer 37.

The MTJ element is thus provided on the flattened insulation layer 35 and underlying conductive layer 40 such that the MTJ element has a flat cross-sectional shape. Since the magnetic characteristics of the MTJ element can be made uniform, the write current for the MTJ element can be made uniform for each memory cell MC in the write operation, and the reliability can be enhanced at the time of data write in the memory cell MC. In other words, this prevents occurrence of stress, tensile force, etc. in the MTJ element due to distortion in the cross-sectional shape of the MTJ element, and an increase in, e.g. a switching field for reversing magnetization. Moreover, since the cross-sectional shape of the MTJ element is flat, the film thickness, etc. of the MTJ element can be made uniform for each memory cell MC. In short, since the resistance value of the MTJ element can be made uniform for each memory cell MC at the time of the read operation and the read margin of the memory cell MC can be enhanced, the reliability at the time of read from the memory cell MC can be enhanced.

Moreover, since the surfaces of the barrier metal layer 38 and yoke layer 36 are formed continuous and flat, the surface of the insulation layer 35 that is formed on the barrier metal layer 38 and yoke layer 36 is also flat. In order to achieve flattening, there is not need to form a thick insulation layer on the Cu wiring layer 37, bury the insulation layer in the trench and flatten the insulation layer. It should suffice to form the insulation layer 35 with such a small thickness as to secure electrical insulation between the word line WL and the MTJ element. It is possible, therefore, to form a thin insulation layer 35. As a result, the distance between the MTJ element and word line WL can be reduced, and a write current can be decreased.

Furthermore, the word line WL includes the yoke layer 36 that contains a high-permeability magnetic material and is formed at the interface between the Cu wiring layer 37 and the inside of the trench. Thus, in the write operation, most of magnetic fluxes that come from the bottom and side surfaces of the word line WL are led to the yoke layer 36. It is possible to prevent the generated magnetic fluxes from extending in random directions, and also to prevent generated magnetic fluxes from interfering with each other, which results in erroneous data write. The above-described yoke layer 36 can reduce the write current that flows in the word line WL. To be more specific, the provision of the yoke layer 36 can advantageously achieve, for example, about double the efficiency (i.e. the write current value is reduced to about ½).

Referring now to FIG. 2 and FIG. 3, a description is given of a method of manufacturing the magnetic memory device according to the first embodiment, taking the magnetic memory device shown in FIG. 1 by way of example.

To start with, using well-known fabrication steps, as illustrated in FIG. 2, a transistor TR, drain contacts DC-1 to DC-3, a source contact SC, a source line SL and an insulation layer 34 are formed on a major surface of a semiconductor substrate 31. Further, using well-known fabrication steps, a trench 39 is formed in the insulation layer 34, and a magnetic film of, e.g. NiFe, which will serve as a yoke layer 36, and a Cu film, which will serve as a Cu wiring layer 37, are formed on the entire surface (not illustrated).

Using, e.g. CMP (Chemical Mechanical Polishing), etching is performed down to the surface of the insulation layer 34 and the structure is flattened at the level of the surface of the insulation layer 34. Thus, the magnetic film and Cu film are buried in the trench 39.

Subsequently, the entire surface of the resultant structure is subjected to wet etching.

On the entire surface, a Ta film, for instance, which will serve as a barrier metal layer 38, is formed using, e.g. CVD (Chemical Vapor Deposition).

The Ta film, as shown in FIG. 3, is polished by, e.g. CMP until the surface of the insulation film 34 is flattened, and the Ta film is buried in the trench 39. Thus, the barrier metal layer 38 is formed on the Cu wiring layer 37.

Then, the Cu wiring layer 37 is subjected to heat treatment, and grain boundaries of Cu metal in the Cu wiring layer 37 are grown. Through these steps, a word line WL is formed. Further, using well-known fabrication steps, the magnetic memory device as shown in FIG. 1 is manufactured.

As has been described above, after the magnetic film and Cu film are buried in the trench 39, the entire surface of the resultant structure is subjected to wet etching. Subsequently, the Ta film that is deposited on the entire surface is polished until the surface of the insulation layer 34 is flattened. The Ta film is thus buried in the trench 39. Thereby, the barrier metal layer 38 is formed on the Cu wiring layer 37.

By the wet etching step, those portions of the Cu film and magnetic film, which are left on the drain contact DC-3 and insulation layer 34, can be removed. Therefore, a short-circuit due to the Cu film, etc., which are left on the drain contact DC-3 and insulation layer 34, can be prevented, and the reliability of the device can be enhanced.

On the other hand, by the wet etching step, the upper surface of the Cu film is recessed below the upper surface of the trench 39 and is distorted in an uneven shape. Then, the Ta film is polished down to the surface of the insulation layer 34 and is flattened. Thereby, the Ta film is buried in the trench 39 and the barrier metal layer 38 is formed on the Cu wiring layer 37. Hence, the word line WL with the flattened upper surface can be formed.

Furthermore, the Cu wiring layer 37 is subjected to heat treatment, and grain boundaries of Cu metal in the Cu wiring layer 37 are grown. In the above-mentioned step, the barrier metal layer 38 is formed on the Cu wiring layer 37, and it is thus possible to prevent the surface of the word line WL from becoming uneven due to the grown grain boundaries in the Cu wiring layer 37. In addition, the grain boundaries of Cu metal in the Cu wiring layer 37 are grown, and the reliability of the Cu wiring layer 37 can be enhanced. As described above, the barrier metal layer 38 also functions as a barrier to the lower surface side of the barrier metal layer 38, which prevents the surface of the word line WL from becoming uneven due to the grain boundaries that are grown in the Cu wiring layer 37 in the heat treatment step.

As has been described above, according to the method of manufacturing the magnetic memory device according to the present embodiment, those portions of the Cu film and magnetic film, which are left on the insulation layer 34, can be removed by the wet etching step. Therefore, a short-circuit can be prevented and the insulation properties can be enhanced. Moreover, the barrier metal layer 38 is buried in the groove 39 over the Cu film that is recessed below the upper surface of the trench 39 and distorted in an uneven shape. Thereby, the word line WL with the flattened upper surface can be formed. Hence, in subsequent fabrication steps, the cross-sectional shape of the MTJ element that is formed on the word line WL can be made flat, and the distance between the word line WL and the MTJ element can be reduced.

[Modification 1 (Modification of Cross-Sectional Shape of MTJ Element)]

Modification 1 of the magnetic memory device and the manufacturing method thereof according to the invention will now be described with reference to FIG. 4 to FIG. 7. A description of the parts common to those in the first embodiment is omitted.

Figure 4:
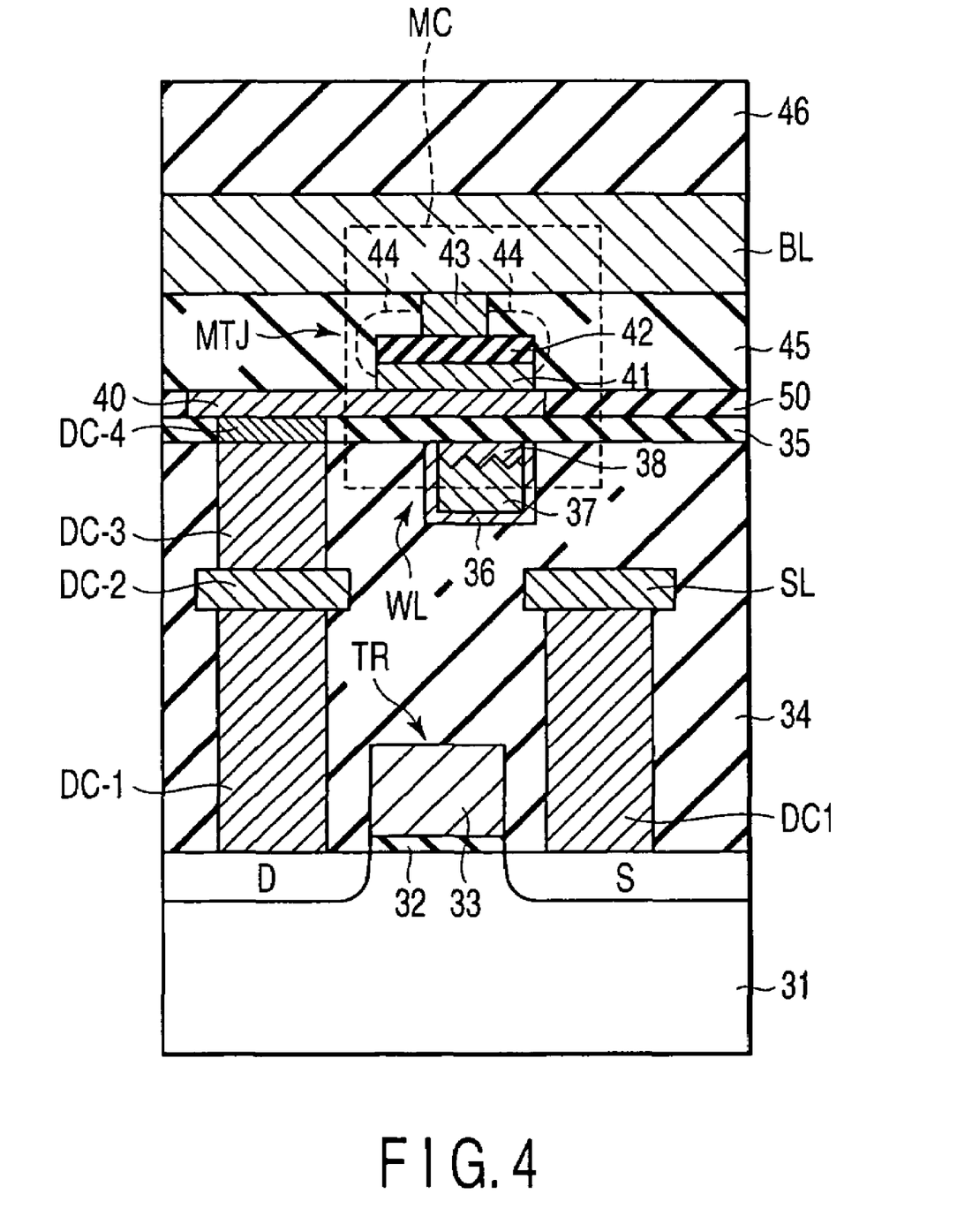
FIG. 4 is a cross-sectional view that schematically shows the structure of a magnetic memory device according to Modification 1 of the present invention.

FIG. 4 is a cross-sectional view that schematically shows the structure of a magnetic memory device according to Modification 1. A free layer 41 and a tunneling barrier layer 42 are provided on an underlying conductive layer 40. Side walls of the free layer 41 and tunneling barrier layer 42 in the direction of the bit line BL are formed to be continuous. A pinned layer 43 is provided on the tunneling barrier layer 42 such that the length of the pinned layer 43 in the direction of bit line BL is less than the length of each of the free layer 41 and tunneling barrier layer 42 in the direction of bit line BL.

According to this magnetic memory device, the same advantages as with the first embodiment can be obtained. In addition, the magnetic memory device of Modification 1 is configured such that the side walls of the free layer 41 and tunneling barrier layer 42 in the direction of the bit line BL are formed to be continuous, and the pinned layer 43 is provided on the tunneling barrier layer 42 such that the length of the pinned layer 43 in the direction of bit line BL is less than the length of each of the free layer 41 and tunneling barrier layer 42 in the direction of bit line BL.

By virtue of this configuration, a distance 44 between the side wall of the free layer 41 and the side wall of the pinned layer 43 becomes greater than in the case where the side walls of the free layer 41, tunneling barrier layer 42 and pinned layer 43 in the direction of the bit line BL are formed to be continuous. Therefore, the insulation between the free layer 41 and pinned layer 43 can be enhanced, and the reliability of the device increased. The thickness of the MTJ element (the total thickness of free layer 41, tunneling insulation film 42 and pinned layer 43) is, e.g. about several Å to several-ten Å. Therefore, Modification 1, in which the distance 44 is increased, is effective for miniaturization.

Figure 5:
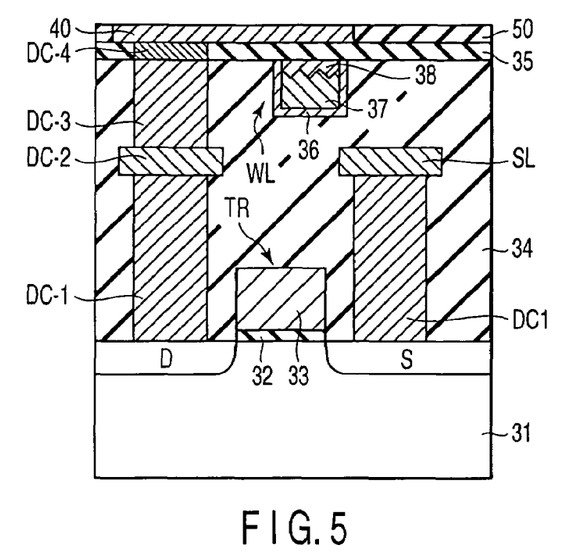
FIG. 5 is a cross-sectional structural view that schematically illustrates a fabrication step in a method of manufacturing the magnetic memory device according to Modification 1 of the present invention.
Figure 6:
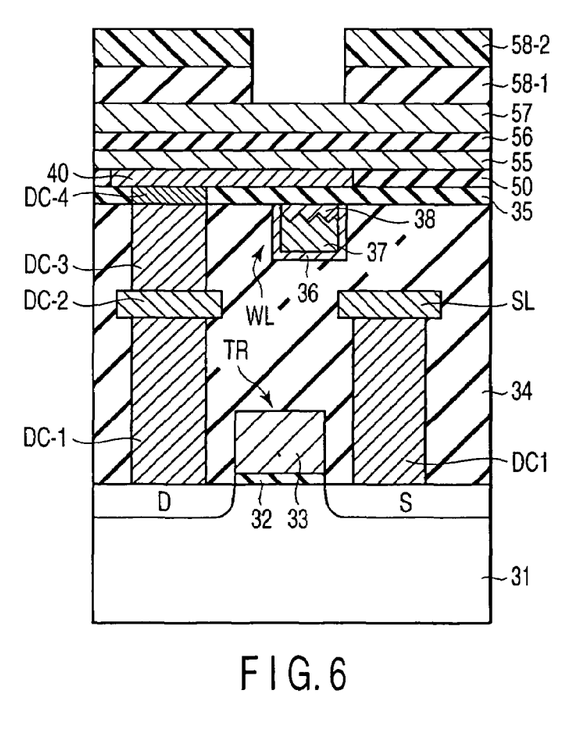
FIG. 6 is a cross-sectional structural view that schematically illustrates a fabrication step in the method of manufacturing the magnetic memory device according to Modification 1 of the present invention.
Figure 7:
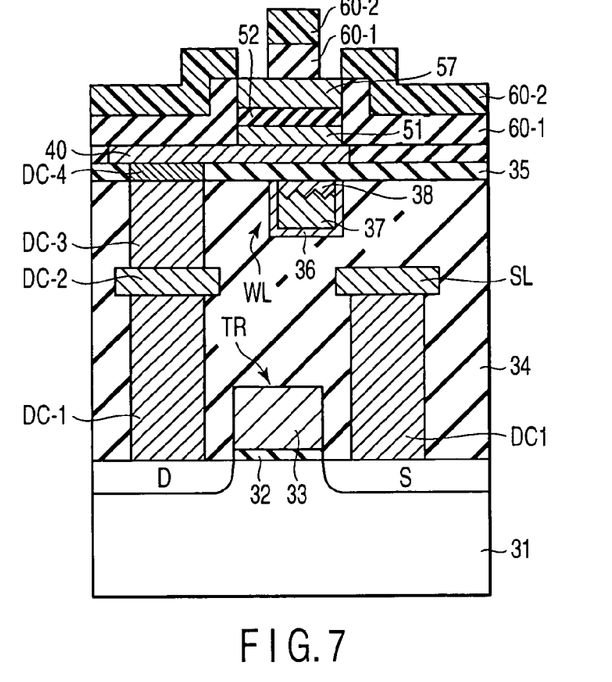
FIG. 7 is a cross-sectional structural view that schematically illustrates a fabrication step in the method of manufacturing the magnetic memory device according to Modification 1 of the present invention.

Referring now to FIG. 5 to FIG. 7, a description is given of a method of manufacturing the magnetic memory device according to Modification 1, taking the magnetic memory device shown in FIG. 4 by way of example.

To start with, using well-known fabrication steps, as illustrated in FIG. 5, a transistor TR and a word line WL are formed on a major surface of a semiconductor substrate 31. Further, insulation layers 35 and 50 and an underlying conductive layer 40 are formed.

Subsequently, as illustrated in FIG. 6, a magnetic film 55, an insulation layer 56, a magnetic film 57 and a hard mask 58-1 are successively formed on the insulation layer 50 and underlying conductive layer 40, using, e.g. CVD. A photoresist 58-2 is coated on the hard mask 58-1.

Then, the photoresist 58-2 is exposed and developed to form a pattern for forming a free layer 41 and a tunneling barrier layer 42. This pattern is transferred to the hard mask 58-1, following which the photoresist 58-2 is removed by an asher. Using the pattern-transferred hard mask 58-1 as a mask, the entire surface of the structure is subjected to anisotropic etching, such as RIE (Reactive Ion Etching), down to the surface of the underlying conductive layer 40. Thus, the free layer 41 and tunnel barrier layer 42 are formed.

Using similar fabrication steps, as illustrated in FIG. 7, a hard mask 60-1, on which a pattern for forming a pinned layer is transferred, and a photo-resist 60-2 are successively formed on the magnetic film 57. The hard mask 60-1 has openings for exposing end portions of the magnetic film 57 in the word line WL direction.

The photoresist 60-2 is then removed by the asher. Using the pattern-transferred hard mask 60-1 as a mask, the entire surface of the structure is subjected to anisotropic etching, such as RIE, down to the surface of the tunneling barrier layer 52. Thus, the pinned layer 43 is formed. Subsequently, the hard mask 60-1 is removed. Similar fabrication steps are performed, and the magnetic memory device as shown in FIG. 4 is manufactured.

According to the above-described manufacturing method, the same advantages as with the first embodiment can be obtained. Further in the manufacturing method of Modification 1, the free layer 41 and tunneling barrier layer 42 are first formed (FIG. 6) and then the pinned layer 43 is formed to have a less length than the free layer 41 and tunneling barrier layer 42 in the bit line BL direction (FIG. 7).

Thus, the pinned layer 43 and free layer 41 can be formed independently (FIG. 6, FIG. 7). In the step of forming the pinned layer 43 (FIG. 7), the surface of the free layer 41 is covered with the hard mask 60-1. Thus, in the step of forming the pinned layer 43, it is possible to prevent a part of the magnetic film 57 from extending beyond the tunneling barrier layer 42 and contacting the free layer 41. Therefore, the insulation properties are improved, and the reliability is enhanced.

In each of the steps of forming the free layer 41 and pinned layer 43, the photoresist 58-2, 60-2 is not directly coated on the magnetic film 55, 57, but is formed on the hard mask 58-1, 58-2. Therefore, when the photoresist 58-2, 60-2 is removed by the asher, it is possible to prevent the magnetism of the magnetic film 55, 57 from deteriorating.

SECOND EMBODIMENT (CROSS-POINT TYPE)

Figure 8:
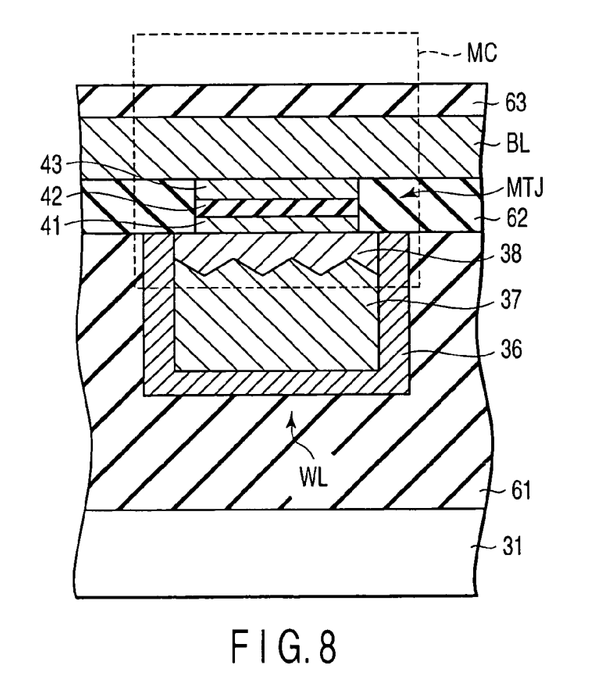
FIG. 8 is a cross-sectional view that schematically shows the structure of a magnetic memory device (cross-point type) according to a second embodiment of the present invention.

A magnetic memory device and a method of manufacturing the same according to a second embodiment of the present invention will now be described with reference to FIG. 8 to FIG. 11. A description of the parts common to those in the first embodiment is omitted. FIG. 8 is a cross-sectional view that schematically shows the structure of the magnetic memory device according to the second embodiment of the invention. The magnetic memory device according to the second embodiment is applied to a so-called cross-point type MRAM.

An MTJ element is provided at an intersection between a word line WL and a bit line BL over a major surface of a semiconductor substrate 31. The MTJ element is so provided as to contact a barrier metal layer 38 of a word line WL.

This structure can bring about the same advantages as with the first embodiment. In addition, the magnetic memory device according to the second embodiment is a so-called cross-point type MRAM wherein the MTJ element is so provided as to contact the barrier metal layer 38. Thus, compared to the 1T1MTJ type MRAMs according to the first embodiment and Modification 1, the transistor TR, insulation layer 35 and underlying conductive layer 40 can be dispensed with, and miniaturization can more effectively be achieved.

Figure 9:
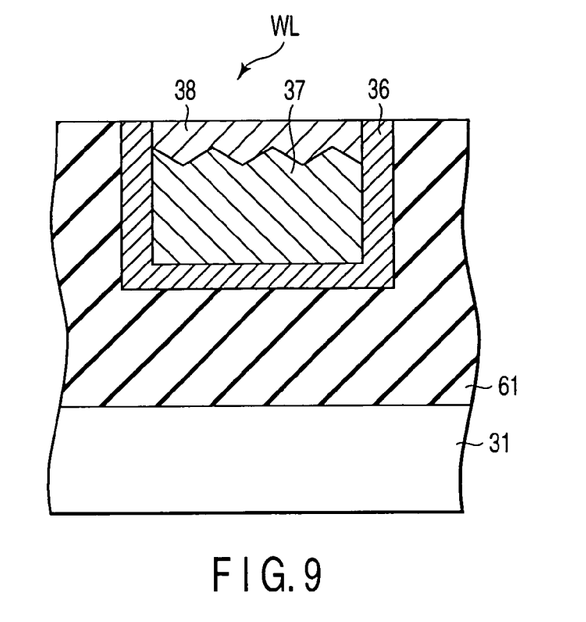
FIG. 9 is a cross-sectional structural view that schematically illustrates a fabrication step in a method of manufacturing the magnetic memory device according to the second embodiment of the present invention.
Figure 10:
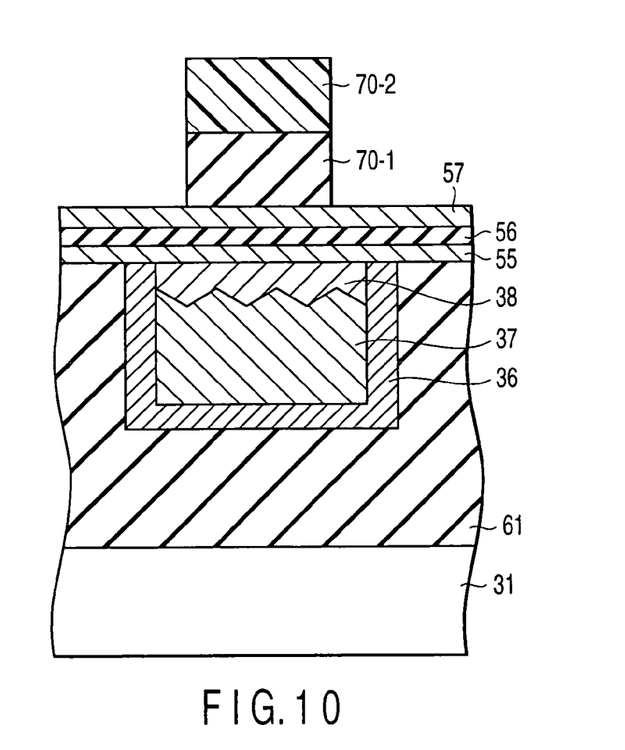
FIG. 10 is a cross-sectional structural view that schematically illustrates a fabrication step in the method of manufacturing the magnetic memory device according to the second embodiment of the present invention.
Figure 11:
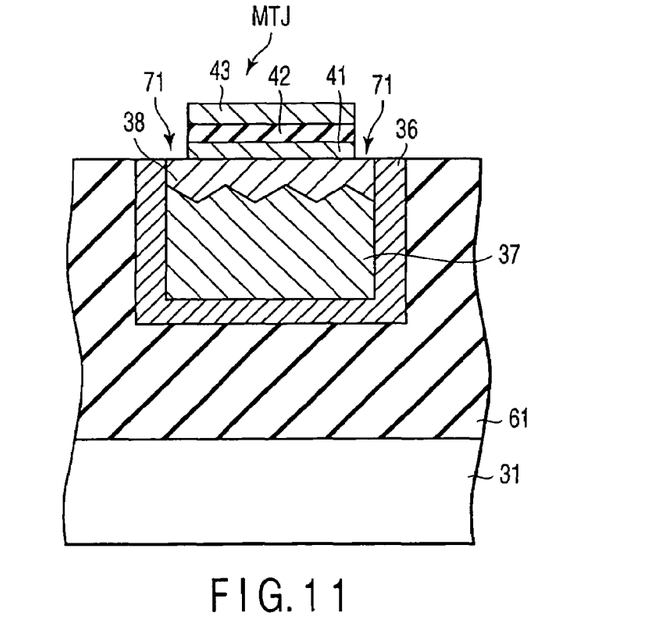
FIG. 11 is a cross-sectional structural view that schematically illustrates a fabrication step in the method of manufacturing the magnetic memory device according to the second embodiment of the present invention.

Next, referring to FIG. 9 to FIG. 11, a description is given of a method of manufacturing the magnetic memory device according to the second embodiment, taking the magnetic memory device shown in FIG. 8 by way of example.

To start with, using the same fabrication steps as described above, a yoke layer 36, a Cu wiring layer 37 and a barrier metal layer 38 are formed in an insulation layer 61 on the major surface of a semiconductor substrate 31, thereby forming a word line WL, as illustrated in FIG. 9.

Then, as illustrated in FIG. 10, a magnetic film 55, an insulation layer 56, a magnetic film 57 and a hard mask 70-1 are successively formed on the insulation layer 61, yoke layer 36 and barrier metal layer 38, using, e.g. CVD. A photoresist 70-2 is coated on the hard mask 70-1. The photoresist 70-2 is exposed and developed so that a pattern for forming the MTJ element is formed on the photoresist 70-2. This pattern is transferred to the hard mask 70-1. Then, the photoresist 70-2 is removed by the asher.

As is shown in FIG. 11, using the pattern-transferred hard mask 70-1 as a mask, the surface of the structure is subjected to anisotropic etching, such as RIE, down to a surface 71 of the barrier metal layer 38. Thus, the MTJ element is formed. The hard mask 70-1 is then removed. Through similar fabrication steps, the magnetic memory device as shown in FIG. 8 is manufactured.

According to the above-described manufacturing method, the same advantages as with the first embodiment can be obtained. In addition, in the step of forming the MTJ element (FIG. 11), the anisotropic etching is carried out down to the surface 71 of the barrier metal layer 38. Thus, the anisotropic etching is performed in the state in which the Cu wiring layer 37 with low hardness is not exposed and is covered with the barrier metal layer 38. Therefore, recessing or chipping of the Cu wiring layer 37 can be prevented. Further, as regards a so-called milling step that mainly involves a physical processing step and is performed prior to the anisotropic etching step, the Cu wiring layer 37 is not directly exposed. Thus, recessing or chipping of the Cu wiring layer 37 can be prevented, and the reliability of the word line WL can be improved. As described above, the barrier metal layer 38 also serves as a barrier to the surface side of the barrier metal layer 38 in order to prevent recessing or chipping of the Cu wiring layer 37 in the anisotropic etching step and milling step.

[Modification 2 (Modification of Yoke Layer)]

Figure 12:
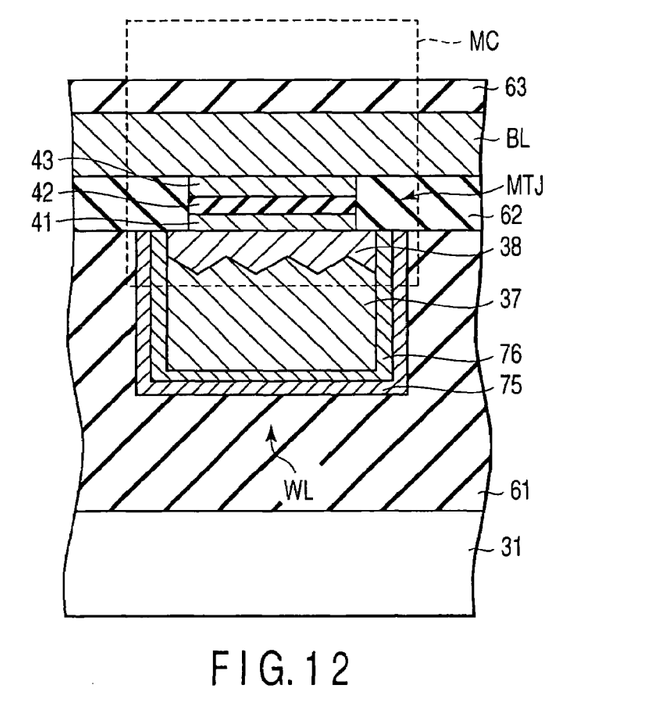
FIG. 12 is a cross-sectional view that schematically shows the structure of a magnetic memory device according to Modification 2 of the present invention.

A magnetic memory device according to Modification 2 of the invention and a method of manufacturing the same will now be described with reference to FIG. 12. A description of the parts common to the first and second embodiments and Modification 1 is omitted. FIG. 12 is a cross-sectional view that schematically shows the structure of the magnetic memory device according to Modification 2.

In Modification 2, the yoke layer comprises a plurality of layers. A first yoke layer 75 is provided in the trench in the insulation layer 61. A second yoke layer 76 is laid over the first yoke layer 75. The first yoke layer 75 is formed of a ferromagnetic material including a high-permeability magnetic material such as NiFe or CoFeNi. Similarly, the second yoke layer 76 is formed of a ferromagnetic material including a high-permeability magnetic material such as NiFe or CoFeNi.

The first yoke layer 75 and second yoke layer 76 are formed in the trench by means of, e.g. sputtering. Alternatively, MOCVD (Metal Organic Chemical Vapor Deposition) or CVD may be adopted. In the other respects, the same steps as described above are performed to manufacture the magnetic memory device shown in FIG. 12.

According to the above-described magnetic memory device and the manufacturing method thereof, the same advantages as with the second embodiment can be obtained. In addition, in the magnetic memory device according to Modification 2, the yoke layer has a multi-layer structure, and the first yoke layer 75 is provided in the trench in the insulation layer 61 and the second yoke layer 76 is laid over the first yoke layer 75. Moreover, each of the first yoke layer 75 and second yoke layer 76 is formed of a ferromagnetic material including a high-permeability magnetic material. Therefore, in the data write operation, of the magnetic fluxes generated from the word line WL, magnetic fluxes that come from the bottom and side surfaces of the word line WL are led to the yoke layers 75 and 76, and the write current can more effectively be reduced.

[Modification 3 (Modification of Cross-Point Type)]

Figure 13:
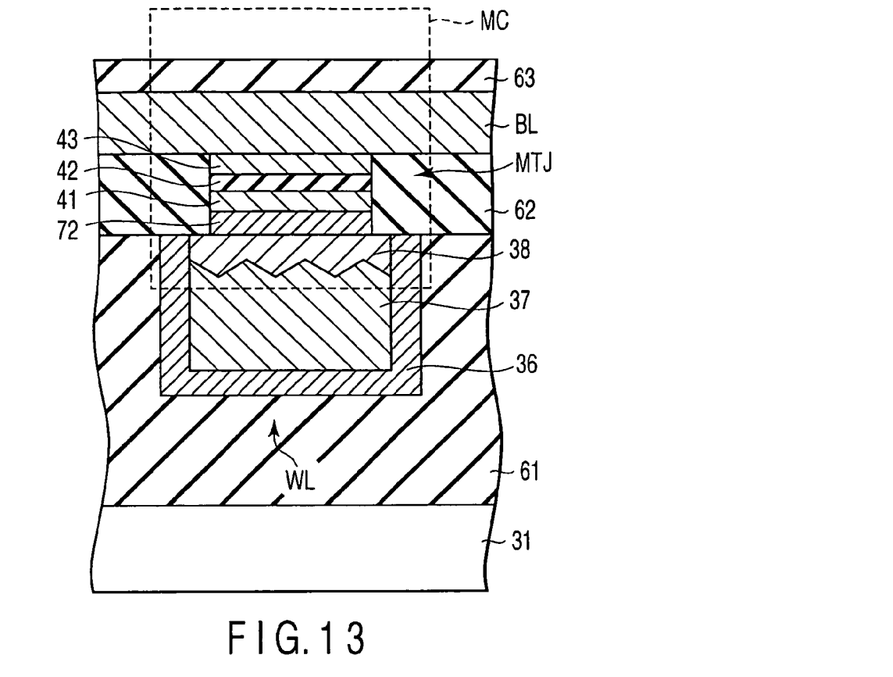
FIG. 13 is a cross-sectional view that schematically shows the structure of a magnetic memory device according to Modification 3 of the present invention.
Figure 14:
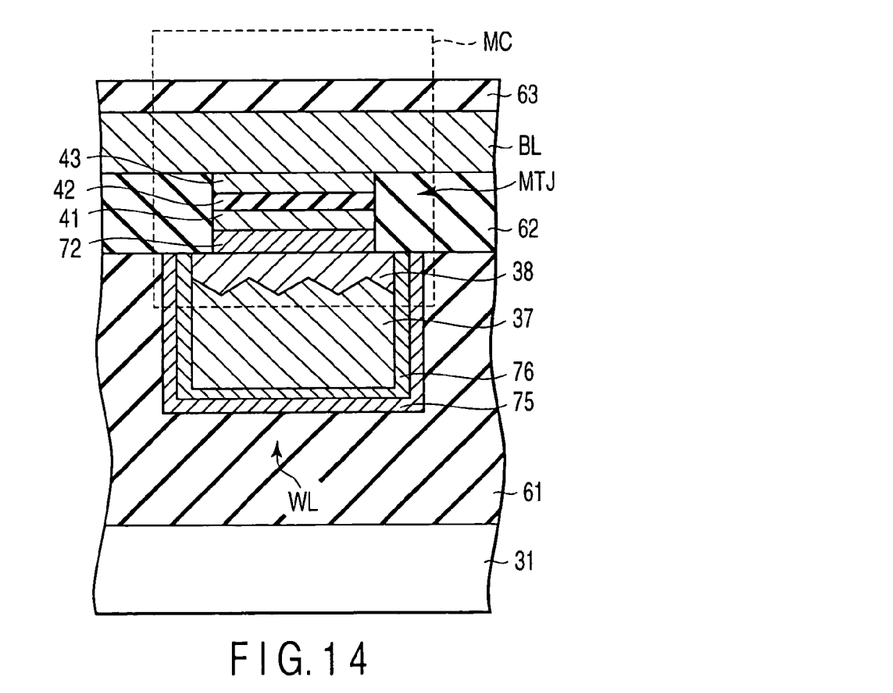
FIG. 14 is a cross-sectional view that schematically shows the structure of a magnetic memory device according to Modification 3 of the present invention.

Magnetic memory devices according to Modification 3 of the invention and methods of manufacturing the same will now be described with reference to FIG. 13 and FIG. 14. A description of the parts common to the first and second embodiments and Modifications 1 and 2 is omitted. FIG. 13 and FIG. 14 are cross-sectional views that schematically show the structures of the magnetic memory devices according to Modification 3.

In Modification 3, a diode layer 72 is additionally provided between the cross-point type MTJ element and the word line WL. In FIG. 13, a diode layer 72 is provided in an insulation layer 62 that is formed on the barrier metal layer 38. The MTJ element is provided on the diode layer 72. In FIG. 14, the yoke layer comprises two yoke layers 75 and 76, and a diode layer 72 is additionally provided. These magnetic memory devices are manufactured through well-known fabrication steps, and a detailed description is omitted. The diode layer 72 is, for example, a PN junction diode layer that is formed of silicon.

The diode layer 72 may be provided between the MTJ element and the bit line BL.

According to the above-described magnetic memory devices, the same advantages as with the second embodiment and Modification 2 can be obtained. In the magnetic memory devices according to Modification 3, the diode layer 72 is additionally provided between the MTJ element and the word line WL.

This structure can prevent a current which flows to an adjacent MTJ element at a time of a write/read operation of an MTJ element. Therefore, the reliability of the magnetic memory device is further improved.

It should suffice if only one diode layer 72 is provided between the MTJ element and the word line WL or between the MTJ element and the bit line BL. Since the cell area in the bit line BL direction does not increase, this structure is effective for miniaturization.

[Modification 4]

Figure 15:
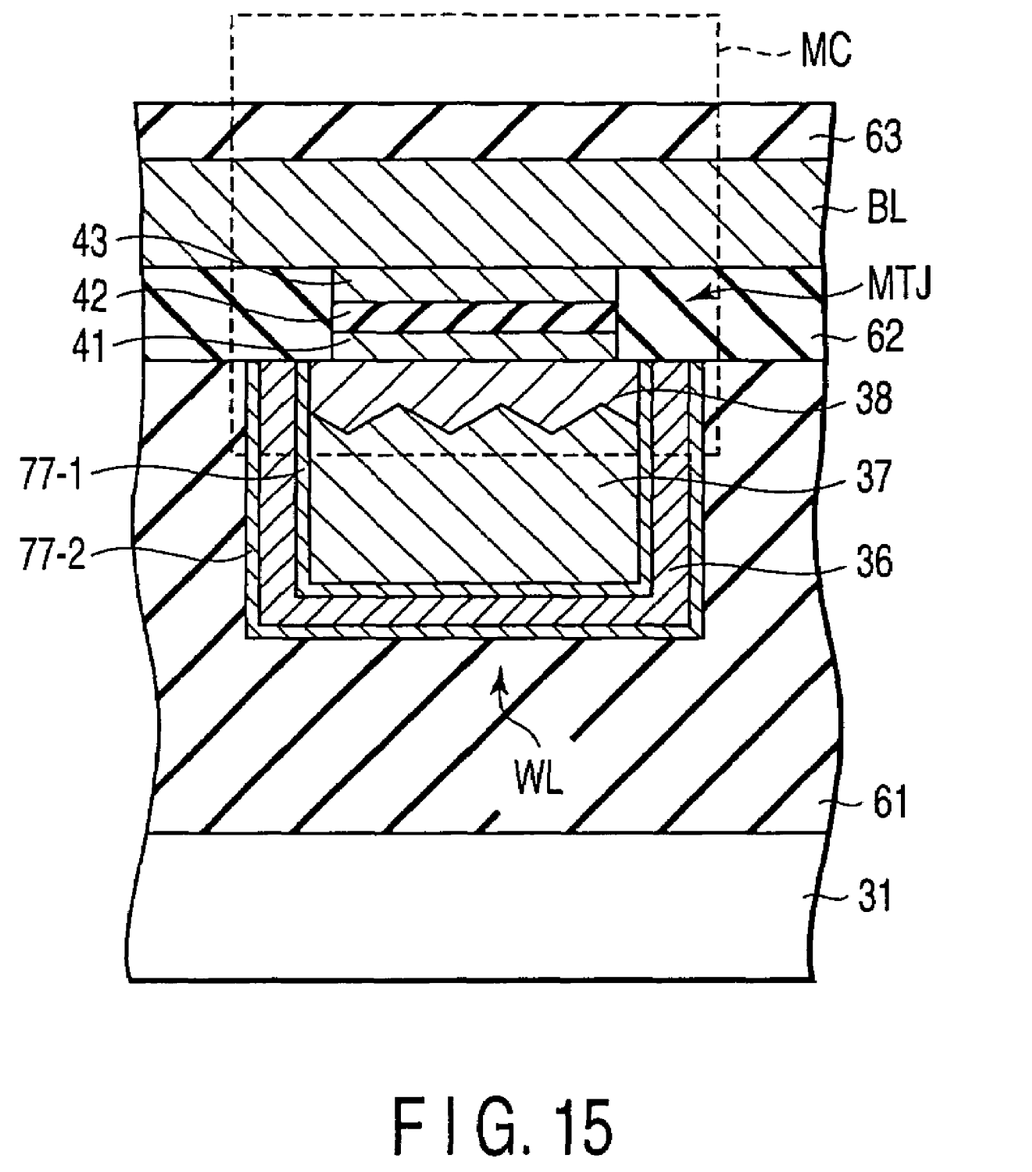
FIG. 15 is a cross-sectional view of the magnetic recording apparatus according to Modification 4 of the present invention.

Fourth modification 4 of the magnetic recording apparatus and method of manufacturing the apparatus will be described, with reference to FIG. 15. FIG. 15 is a sectional view of the magnetic recording apparatus according to the fourth modification. The components identical to those of the first, second and third modifications will not be described.

As FIG. 15 shows, a barrier metal layer 77-1 is provided at the interface between the yoke layer 36 and the wiring layer 37 and a barrier metal layer 77-2 is provided at the interface between the yoke layer 36 and the insulating layer 61. These layers 77-1 and 77-2 are formed by a method known in the art.

Having the structure of FIG. 15, the apparatus achieves the same advantages as the first, second and third modifications. Further, the barrier metal layer 77-1 prevents the material of the yoke layer 36 from diffusing into the wiring layer 37, and the material of the wiring layer 37 from diffusing into the yoke layer 36. Similarly, the barrier layer 77-2 prevents the material of the yoke layer 36 from diffusing into the insulating layer 61, and the material of the insulating layer 61 from diffusing into the yoke layer 36. Thus, the yoke layer 36 can maintain its magnetic characteristics. In short, the barrier metal layers 77-1 and 77-2 help to maintain the magnetic characteristics of the yoke layer 36.

Needless to say, the barrier metal layers 77-1 and 77-2 can be provided in the embodiments described above, and also in the first, second and third modifications.

In the first and second embodiments and Modifications 1 to 4, MTJ elements are employed by way of example. The present invention, however, is not limited to MTJ elements and is applicable to magnetic memory devices including other magneto-resistance effect elements such as GMR (Giant Magneto-Resistance) elements and CMR (Colossal Magneto-Resistance) elements.

In the first and second embodiments and Modifications 1 to 4, the Cu wiring layer 37 is used as the wiring layer of the word line WL by way of example. Other metal layers, such as an Al wiring layer, may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
    a lower write wiring line including a wiring layer formed in a trench in an insulation layer,
    a barrier metal layer buried only in the trench over the wiring layer, an entire surface of the wiring layer at the barrier metal layer being uneven, and an entire surface of the barrier metal layer being flatter than the surface of the wiring layer at the barrier metal layer;

a first yoke layer that is provided between an inside of the trench and the wiring layer, and having a surface that is continuous with a surface of the barrier metal layer;

a magneto-resistance effect element provided above the central part of the surface of the barrier metal layer;

an underlying conductive layer that is provided between the lower write wiring line and the magneto-resistance effect element and is in contact with the magneto-resistance effect element; and an insulation layer that is formed on the barrier metal layer.

2. The magnetic memory device according to claim 1, further comprising:

a higher write wiring line that is provided on the magneto-resistance effect element in a direction crossing the lower write wiring line and is in contact with the magneto-resistance effect element, wherein the lower write wiring line is in contact with the magneto-resistance effect element.

3. The magnetic memory device according to claim 1, wherein the lower write wiring line further comprises a second yoke layer that is provided between the first yoke layer and the wiring layer and has a surface that is continuous with a surface of the barrier metal layer and a surface of the first yoke layer.

4. The magnetic memory device according to claim 1, further comprising:

a higher write wiring line that is provided on the magneto-resistance effect element in a direction crossing the lower write wiring line, wherein the underlying conductive layer includes a region that extends from an intersection between the lower write wiring line and the higher write wiring line in the same direction as the lower write wiring line.

5. The magnetic memory device according to claim 4, further comprising an insulated-gate field-effect transistor with a current path having one end connected to said region that is included in the underlying conductive layer.

6. The magnetic memory device according to claim 1, wherein the magneto-resistance effect element comprises:

a first ferromagnetic layer that is provided on the lower write wiring line;

a tunneling barrier layer that is provided on the first ferromagnetic layer; and a second ferromagnetic layer that is provided on the tunneling barrier layer.

7. The magnetic memory device according to claim 6, wherein side walls of the first magnetic layer and the tunneling barrier layer in a direction of the lower write wiring line are continuous, and a length of the second magnetic layer in a direction crossing the lower write wiring line is less than a length of each of the first magnetic layer and the tunneling barrier layer in the direction crossing the lower write wiring line.

8. The magnetic memory device according to claim 1, wherein the first yoke layer includes a ferromagnetic material.

9. The magnetic memory device according to claim 3, wherein the second yoke layer includes a ferromagnetic material.

10. The magnetic memory device according to claim 1, wherein the wiring layer includes Cu or Al.

11. The magnetic memory device according to claim 1, wherein the baffler metal layer includes at least one of Ta, Ti, TiN and TaN.

12. The magnetic memory device according to claim 2, further comprising:

a diode layer that is provided between the barrier metal layer and the magneto-resistance effect element.

13. The magnetic memory device according to claim 1, wherein the surface of the barrier metal layer is flattened by CMP.

14. The magnetic memory device according to claim 1, wherein the first yoke layer is continuously provided.

15. The magnetic memory device according to claim 3, wherein the second yoke layer is continuously provided.

16. The magnetic memory device according to claim 1, wherein an end surface of the first yoke layer and the surface of the barrier metal are even.

17. The magnetic memory device according to claim 3, wherein an end surface of the second yoke layer and the surface of the barrier metal are even.

* * * * *